United States Patent
Schlott et al.

(10) Patent No.: US 6,187,253 B1
(45) Date of Patent: Feb. 13, 2001

(54) METHOD OF PREPARING INDIUM OXIDE/ TIN OXIDE TARGET FOR CATHODIC SPUTTERING

(75) Inventors: Martin Schlott, Hanau am Main; Wolfgang Dauth, Frankfurt am Main; Martin Kutzner, Neuberg, all of (DE); Bruce Gehman; Shawn Vahlstrom, both of Morgan Hill, CA (US)

(73) Assignee: Leybold Material GmbH, Hanau (DE)

( * ) Notice: Under 35 U.S.C. 154(b), the term of this patent shall be extended for 0 days.

(21) Appl. No.: 08/963,053

(22) Filed: Nov. 3, 1997

Related U.S. Application Data

(62) Division of application No. 08/587,471, filed on Jan. 17, 1996, now abandoned.

(30) Foreign Application Priority Data

Mar. 11, 1997 (DE) .......................................... 195 08 8980

(51) Int. Cl.$^7$ ................................................... C04B 35/457
(52) U.S. Cl. ..................... 264/604; 264/653; 264/564; 264/658; 264/663; 264/674; 204/298.13; 501/134
(58) Field of Search ..................................... 264/604, 674, 264/653, 654, 658, 663; 501/134

(56) References Cited

U.S. PATENT DOCUMENTS

| | | | |
|---|---|---|---|
| 4,690,745 | | 9/1987 | Klein ................................ 204/192.29 |
| 4,962,071 | * | 10/1990 | Bayard .................................. 501/134 |
| 5,071,800 | | 12/1991 | Iwamoto et al. ...................... 501/126 |
| 5,094,787 | * | 3/1992 | Nakajima .............................. 264/674 |
| 5,160,675 | * | 11/1992 | Iwamoto et al. ...................... 264/681 |
| 5,401,701 | | 3/1995 | Ogawa et al. ......................... 501/134 |
| 5,433,901 | * | 7/1995 | Rancoule .............................. 264/648 |
| 5,480,531 | * | 1/1996 | Weigert ................................. 501/134 |
| 5,480,532 | | 1/1996 | Schlott et al. .................... 204/298.13 |
| 5,531,948 | * | 7/1996 | Schlott ................................. 264/122 |
| 5,700,418 | * | 12/1997 | Hörmann ............................. 264/604 |
| 5,700,419 | * | 12/1997 | Matsunaga ........................... 264/674 |

FOREIGN PATENT DOCUMENTS 4124471  6/1992  (DE) .

\* cited by examiner

*Primary Examiner*—James Derrington
(74) *Attorney, Agent, or Firm*—Fulbright & Jaworski, LLP

(57) ABSTRACT

An indium oxide/tin oxide powder with 5–15 wt. % tin oxide is subjected to an annealing treatment at $T \geq 1,000°$ C. and is then partially reduced and subjected to hot isostatic pressing to produce a sputtering target with a density of at least 95% of the theoretical density and a thermal conductivity of at least 14 $Wm^{-1}K^{-1}$.

1 Claim, No Drawings

METHOD OF PREPARING INDIUM OXIDE/TIN OXIDE TARGET FOR CATHODIC SPUTTERING

This is a Divisional Application of application Ser. No. 08/587,471, filed Jan. 17, 1996, now abandoned.

BACKGROUND OF THE INVENTION

The invention pertains to an indium oxide/tin oxide sputtering target for cathodic sputtering with 5–15 wt. % of tin oxide and with a density of at least 95% of the theoretical (maximum) density and to a process for the production of these targets by hot isostatic pressing.

Oxide ceramic targets of indium oxide-tin oxide (ITO) are used for the production of thin, transparent, electrically conductive layers by cathodic sputtering. Layers such as these are used primarily in flat image screen technology. The thin indium oxide/tin oxide layers can be produced either by the sputtering of metal targets in a reactive atmosphere containing oxygen or by the sputtering or oxide ceramic targets. The sputtering process with oxide ceramic targets offers the advantage that, because there is only a weak flow of oxygen in the sputtering chamber, it is easier to regulate the sputtering process than it is when sputtering is carried out at the high oxygen flows required for sputtering with metal targets.

Because indium oxide/tin oxide is a ceramic material which has much lower thermal conductivity than metals and which at the same time is highly sensitive to the thermal stress resulting from uneven heating during the sputtering process, there is great interest in being able to produce targets with good thermal conductivity. These targets would then make it possible to carry out the sputtering operation at a higher specific power density without running the risk that the targets will fail as a result of cracking or fracturing. If it is possible to operate at a higher sputtering rate, production can be carried out with a higher substrate throughput, which increases the capacity of the system and lowers production costs. In addition, a target with better thermal conductivity means that, if the sputtering rate is not increased, the temperature at the surface of the target will be lower. The reduced heat gradient reduces the thermal stresses in the target material and therefore reduces the likelihood of target failure and increases the reliability of sputtering operations. This is especially true when the process is carried out with cathodes which are operated in a pulsed manner.

Systematic studies were therefore conducted to discover a set of conditions under which it would be possible to produce targets consisting of mixtures of indium oxide and tin oxide containing 5–15 wt. % tin oxide which have significantly better thermal conductivity than that of conventional targets. The targets currently obtainable on the market have a thermal conductivity of no more than 10 $Wm^{-1}K^{-1}$. As a rule, values of only 7–9 $Wm^{-1}K^{-1}$ are reached.

Preliminary experiments showed that a basic condition for high thermal conductivity is the highest possible density of the target material, i.e., a density of $\geq 95\%$ of the theoretical density. This alone, however, did not prove to be enough. Through variation of the powder treatment and powder compaction steps, an attempt was made to find conditions under which not only a high target density but also a high thermal conductivity would be obtained. It was found that the processes according to the state of the art described did not lead to good results.

Partially reduced indium oxide/tin oxide targets and methods for their production are described in U.S. Pat. No. 4,690,745 (Klein). According to this patent, indium oxide/tin oxide powder mixtures are hot-pressed under reducing conditions at 850–1,000° C., the oxides being hot-pressed in a graphite hot-press mold or under the addition of carbon or carbon-releasing organic material. By pressing under these conditions, the oxides are partially reduced, so that a target is formed with a slightly depleted oxygen content, i.e., an oxygen content slightly below that of the stoichiometric composition.

By means of this process, targets with densities of only up to 91% of the theoretical density (TD), with an unsatisfactory thermal conductivity of $\geq 8$ $Wm^{-1}K^{-1}$, and with poor electrical conductivity (p=0.1–0.6 Ω-cm) are produced.

Processes for the production of partially reduced ITO targets by the use of pre-reduced powder and subsequent hot-pressing or hot isostatic pressing are described in DE 41 24 471 (Weigert) and in DE 44 07 774 (Schlott). Studies on the influence of the degree of reduction of the ITO powder on the thermal conductivity of the target material have shown that, on average, a higher thermal conductivity is obtained when the targets are partially reduced. On the basis of the processes described, however, it was not possible to arrive at targets with thermal conductivities of more than 11 $Wm^{-1}K^{-1}$.

Processes for the production of ITO targets by sintering have been described by various authors (U.S. Pat. No. 5,071,800 (Tosoh Corp., JP 4-1293707 (Dowa)). Targets produced according to the processes described are not usually dense enough ($\leq 90$ TD). The thermal conductivities reached in these cases are only around $\leq 9$ $Wm^{-1}K^{-1}$.

The task of the present invention is therefore to avoid the disadvantages of the known target materials with respect to insufficient thermal conductivity and to create an oxide ceramic target with high thermal conductivity.

SUMMARY OF THE INVENTION

According to the invention, indium oxide/tin oxide powder containing 5–15 wt. % of tin oxide is used, at least one of the selected powder components being annealed at T $\geq 1,000°$ C., whereupon the powder is then partially reduced if desired and then compacted by hot isostatic pressing at temperatures of T$\geq 800°$ C. As a result, a target is obtained which has a thermal conductivity of at least 14 $Wm^{-1}K^{-1}$ and a density of more than 95% of the theoretical density.

The surprising discovery was made in the course of the experiments that the annealing of the starting powder or powders or of one of the components of the starting powders at temperatures above 1,000° C. leads, in conjunction with the partial reduction of the powder and subsequent compaction by hot isostatic pressing at sufficiently high temperatures (T $\geq 800°$ C.), to a significant increase in the thermal conductivity to values of more than 14 $Wm^{-1}K^{-1}$. The annealing treatment is the basic, crucial requirement. It apparently leads to a purification of the grain boundaries, completing the reaction which leads to the oxides in question. Because the annealing treatment according to the invention also leads to recrystallization and to a decrease in the BET surface area, it has been found that the sintering properties which such powders end up with are very poor. Compaction must therefore be conducted by pressurized sintering under high pressure.

The partial reduction step and the choice of a sufficiently high compacting temperature also have positive effects on the thermal conductivity. It has been possible to observe not only an increase in the thermal conductivity but also a significant decrease in the specific electric resistance of the target material to values of $\leq 300$ $\mu\Omega$-cm and an increase in the density to values frequently in excess of 98% TD. In especially favorable cases, it has even been possible to achieve resistance values of <120 $\mu\Omega$-cm and densities of >99%.

The targets produced in accordance with the present invention were compared during sputtering with targets which were produced in accordance with one of the conventional processes. Whereas the conventional target with a thermal conductivity of 9 $Wm^{-1}K^{-1}$ and a density of 96.1% began to show cracks above a power density of 5 $W/cm^2$, the target produced according to the present invention with a density of 98.2% and a thermal conductivity of 15.8 $Wm^{-1}K^{-1}$ could be operated even at 10 $W/cm^2$ without showing any signs of cracking.

EXAMPLES

| Powder Used | Annealing Temperature (°C.) | Reduction Treatment | Compaction process | at T, °C. | Density of the Target, % TD (% TD) | Thermal Conductivity W/m/K | Structure |
|---|---|---|---|---|---|---|---|
| A 90 wt. % $In_2O_3$ + 10 wt. % $SnO_2$ | 1200 1200 | yes | HIP | 900 | 98.2 | 15.8 | $In_2O_3$, $SnO_2$, In/Sn |
| B 90 wt. % $In_2O_3$ + 10 wt. % $SnO_2$ | — — | yes | HIP | 650 | 96.1 | 9.0 | $In_2O_3$, $SnO_2$, In/Sn |
| A 90 wt. % $In_2O_3$ + 10 wt. % $SnO_2$ (co-precipitated) | 1450 (for the mixture) | yes | HIP | 975 | 99.2 | 16.5 | $In_2O_3$, $SnO_2$, (mixed crystal) In/Sn |
| B 90 wt. % $In_2O_3$ + 10 wt. % $SnO_2$ (co-precipitated) | 600 (for the mixture) | yes | HIP | 700 | 97.3 | 10.8 | $In_2O_3$, $SnO_2$, In/Sn |
| A 95 wt. % $In(OH)_3$ + 5 wt. % $SnO_2$ | 1100 | yes | HIP | 850 | 97.0 | 14.1 | $In_2O_3$, $SnO_2$, In/Sn |
| B 90 wt. % $In(OH)_3$ + 10 wt. % $SnO_2$ | 600 | no | HIP | 930 | 92.4 | 6.8 | $In_2O_3$, $SnO_2$, In/Sn |
| B 90 wt. % $In(OH)_3$ + 10 wt. % $SnO_2$ | — — | no | sintering | 1500 | 84.1 | 5.9 | $In_2O_3$, $SnO_2$. (mixed crystal) |

A = in accordance with the present invention
B = comparison example
HIP = hot isostatic pressing in sealed steel cans
HP = hot pressing in a graphite mold

What is claimed is:

1. A method for manufacturing an indium oxide/tin oxide sputtering target comprising:

provIding a powder consisting essentially of co-precipitated $In_2O_3$ and $SnO_2$, said mixture containing 5–15% by wt. $SnO_2$;

annealing said mixture at a temperature of from 1350° C. to 1650° C. so that solid solutions of $In_2O_3$ and $SnO_2$ are formed and that the grain size is in the range of 2 to 50 microns;

partially reducing the annealed powder, and compacting the partially reduced annealed powder with hot isostatic pressing at a temperature above 800° C.

* * * * *

UNITED STATES PATENT AND TRADEMARK OFFICE
CERTIFICATE OF CORRECTION

PATENT NO. : 6,187,253 B1
DATED : February 13, 2001
INVENTOR(S) : Schlott et al.

Page 1 of 1

It is certified that error appears in the above-identified patent and that said Letters Patent is hereby corrected as shown below:

<u>Title page,</u>
Item [30] in the section entitled <u>Foreign Application Priority Data</u>, change "1997" to -- 1995 --.

In the section entitled <u>Foreign Application Priority Data</u>, change "195 08 8980" to -- 195 08 898 --.

<u>Column 2,</u>
Line 7, change ">" to -- < --.

Signed and Sealed this

Twenty-first Day of August, 2001

*Attest:*

*Attesting Officer*

NICHOLAS P. GODICI
*Acting Director of the United States Patent and Trademark Office*